(12) United States Patent
Lahbib et al.

(10) Patent No.: US 11,610,916 B2
(45) Date of Patent: Mar. 21, 2023

(54) TRANSFER PRINTING FOR RF APPLICATIONS

(71) Applicant: X-FAB France SAS, Corbeil-Essonnes (FR)

(72) Inventors: Imène Lahbib, Corbeil-Essonnes (FR); Jérôme Loraine, Corbeil-Essonnes (FR); Frédéric Drillet, Corbeil-Essonnes (FR); Albert Kumar, Corbeil-Essonnes (FR); Gregory U'ren, Corbeil-Essonnes (FR)

(73) Assignee: X-FAB France SAS, Corbeil-Essonnes (FR)

( * ) Notice: Subject to any disclaimer, the term of this patent is extended or adjusted under 35 U.S.C. 154(b) by 194 days.

(21) Appl. No.: 16/866,902

(22) Filed: May 5, 2020

(65) Prior Publication Data

US 2020/0365619 A1    Nov. 19, 2020

(30) Foreign Application Priority Data

May 13, 2019   (FR) ...................................... 1904958

(51) Int. Cl.
| | |
|---|---|
| *H03F 3/193* | (2006.01) |
| *H01L 27/12* | (2006.01) |
| *H01L 29/00* | (2006.01) |
| *H01L 29/20* | (2006.01) |

(52) U.S. Cl.
CPC ...... *H01L 27/1203* (2013.01); *H01L 29/2003* (2013.01); *H03F 3/193* (2013.01)

(58) Field of Classification Search
CPC ............. H01L 27/1203; H01L 29/2003; H01L 27/0629; H01L 27/0688; H01L 21/8258; H01L 27/0617; H01L 27/12; H03F 3/193; H03K 17/687; B41M 5/025
USPC .................................................. 330/277, 307
See application file for complete search history.

(56) References Cited

U.S. PATENT DOCUMENTS

| | | | |
|---|---|---|---|
| 10,886,911 B2* | 1/2021 | Willard | ............... H01L 27/1203 |
| 2014/0239346 A1 | 8/2014 | Green et al. | |
| 2017/0316932 A1 | 11/2017 | Ohlsson et al. | |
| 2017/0359059 A1 | 12/2017 | Bazzani et al. | |
| 2018/0083579 A1 | 3/2018 | Noori et al. | |
| 2018/0109250 A1 | 4/2018 | Shah et al. | |
| 2018/0331156 A1 | 11/2018 | Then et al. | |

FOREIGN PATENT DOCUMENTS

| | | |
|---|---|---|
| JP | 2007006179 A | 1/2007 |
| JP | 2013206942 A | 10/2013 |
| WO | WO 2019/094052 A | 5/2019 |

OTHER PUBLICATIONS

Campbell, "Gallium Nitride Power MMICs—Promise and Problems," Integrated Nonlinear Microwave and Millimetre-Wave Circuits Workshop, IEEE, Oct. 2015—6 pages.

(Continued)

*Primary Examiner* — Hieu P Nguyen
(74) *Attorney, Agent, or Firm* — Dority & Manning, PA

(57) ABSTRACT

A semiconductor structure for RF applications comprises: a first μTP GaN transistor on an SOI wafer or die; and a first resistor connected to the gate of said first transistor.

14 Claims, 17 Drawing Sheets

(56) References Cited

OTHER PUBLICATIONS

Lerner et al., "Flexible and Scalable Heterogeneous Integration of GaN HEMTs on Si-CMOS by Micro-Transfer-Printing," Phys. Status Solidi A: Applications and Materials Science, vol. 215, Apr. 2018—7 pages.
Combined Search and Examination Report for corresponding Application No. GB 1912509.5—15 pages.
Further Search Report for corresponding Application No. GB1912509. 5, dated Aug. 25, 2020—4 pages.
Chang et al, "A Novel Post-Linearization Technique for Fully Integrated 5.5 GHz High-Linearity LNA", International Conference on Innovative Computing, Information and Control, Dec. 7-9, 2009, Washington. DC, United States, pp. 577-580.
Preliminary Research Report, for corresponding Application No. FR2200952, dated Oct. 11, 2022, 9 pages.
Preliminary Research Report for corresponding Application No. FR2200772, dated Sep. 22. 2022, 10 pages.
Sato et al, "Q-Band InAlGaN/GaN LNA using Current Reuse Topology", International Microwave Symposium, May 22-27, 2016, San Francisco, California, United States, 4 pages.
Tinella et al, "Partially Depleted CMOS SOI Technology for Low Power RF Applications", European Gallium Arsenide and Other Semiconductor Application Symposium. Oct. 3-4, 2005, Paris, France, 4 pages.
Weber et al, "A Beyond 110 GHz GaN Cascode Low-Noise Amplifier with 20.3 dBm Output Power", International Microwave Symposium, Jun. 10-15, 2018, Philadelphia, Pennsylvania, United States, pp. 1499-1502.
Yook et al, "Small and Low-profile GaN Hybrid-IC LNA using Embedded-IC Process in Silicon", International Microwave Workshop Series on Advanced Materials and Processes, Sep. 20-22, 2017, Pavia, Italy, 3 pages.

* cited by examiner

TRANSFER PRINTING FOR RF APPLICATIONS

PRIORITY CLAIM

The present application is based on and claims priority to France Application Serial No. 1904958, having a filing date of May 13, 2019, which is incorporated by reference herein.

TECHNICAL FIELD

The present invention concerns transfer printing for RF applications and in particular micro transfer printing of GaN components onto an SOI wafer.

BACKGROUND

GaN is a relatively new technology compared to other semiconductors, such as Si and GaAs, but it has become the technology of choice for high-RF, power-hungry applications like those required to transmit signals over long distances or at high-end power levels. GaN transistors provide high power density, high operating temperatures, improved efficiency, low on-resistance, and they can be operated in different frequency bands ranging from 1 GHz to 110 GHz. FIG. 1 shows a schematic diagram of a cross-section of a GaN transistor 2. The GaN layer 4 is formed on a high resistivity (HR) silicon substrate 6 and an AlGaN buffer layer 8. Heavily doped n++ regions 10 of the GaN are connected to metal contacts 12 (drain and source). The gate 14 is isolated from the GaN layer 4 by a thin AlN layer 16.

GaN-on-SiC combines the high power density capabilities of GaN with the superior thermal conductivity and low RF losses of SiC (Silicon Carbide). GaN-on-SiC is the combination of choice for high power density RF performance.

GaN-on-Si combination has a much poorer thermal performance and higher RF losses but is cheaper. GaN-on-Si is the combination of choice for price-sensitive power electronics applications.

Silicon on insulator (SOI) technology is used in semiconductor manufacturing, especially microelectronics, to reduce parasitic capacitance by having a layered silicon-insulator-silicon substrate structure (rather than bulk Si). SOI CMOS provides lower power consumption for analogue and digital RF mixed circuits in the design of low power RF transceivers thanks to its low leakage capabilities.

To achieve some of the advantages of both GaN and SOI in high power applications, attempts have been made to grow GaN on SOI, using trench etching to isolate GaN transistors. Careful strain engineering is required to control the stress built up in the wafer during growth.

Alternatively, micro-transfer printing [1] can be used to transfer a GaN device from a native/source wafer to a target SOI wafer. In this process, the GaN device is detached/lifted from the native wafer it was grown on and re-attached on the SOI wafer.

[1] R. Lener, and all "Heterogeneous Integration of Microscale Gallium Nitride Transistors by Micro-Transfer-Printing", 2016 IEEE 66th Electronic Components and Technology Conference, pp 1186-1189.

SUMMARY OF THE INVENTION

Aspects of the present invention provide semiconductor structures for RF applications and methods of manufacturing such as set out in the accompanying claims.

Preferred embodiments of the invention will now be described, by way of example only, with reference to the accompanying drawings.

DETAILED DESCRIPTION

Figure 1:
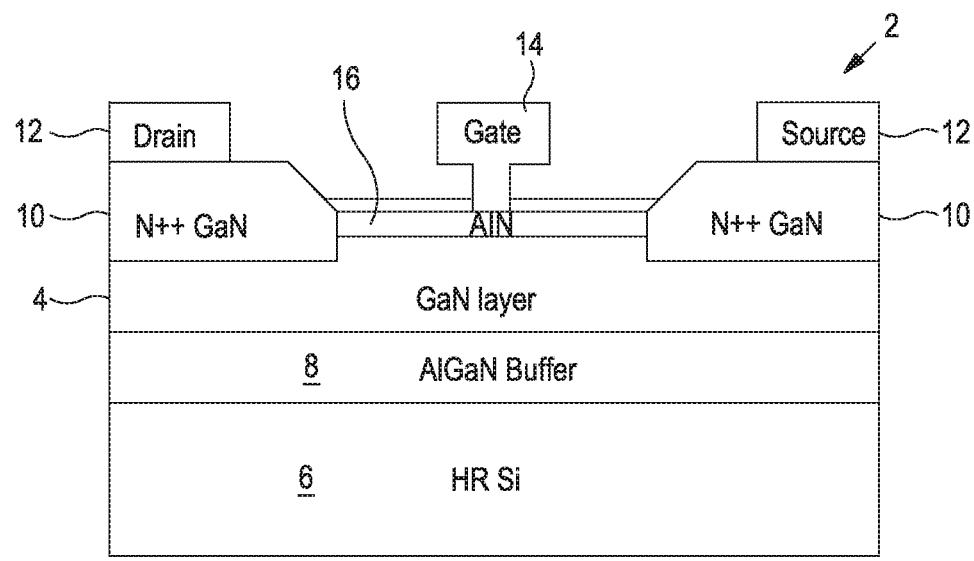
FIG. 1 is a schematic cross-section of a GaN transistor on a silicon substrate.

More and more applications nowadays require high linearity, high power handling, low noise figure and low power consumption. As these requirements are in most cases antagonistic, they are very hard to achieve in MMIC (Monolithic Microwave Integrated Circuit) circuitry. For that reason, it is common to use system in package (SiP) techniques to enclose in a single module several integrated circuits from several technologies, to benefit from the best of each one of them. Dies will then be connected together using bonding wires or bumps. This SiP technique allows a system level integration of several dies/technologies.

Embodiments described herein allow monolithic integration of the GaN and SOI technologies by micro-transfer printing. The CMOS devices as well as the high-electron mobility transistors (HEMTs) are fabricated separately in their process environments and can have different wafer diameters, The idea will be to design most of the circuit on SOI technology and print only a few HEMTs on the top of the SOI wafer to enhance the overall RF circuit performance.

An advantage of this technique is having a monolithic circuit resulting in a smaller, cheaper and less complex circuit than a system in package. In addition to the reduction of the complexity and cost, this heterogeneous design method can achieve better control of parasitic elements and performance. Another advantage is linked to the GaN transistor performance. The vertical isolation of the existing GaN on silicon technology is poor. The micro-transfer printing can significantly reduce this vertical leakage and thus improves the HEMT voltage breakdown.

This heterogeneous design method allows the best of both GaN and SOI to be combined. Thus, achieving good Noise Figure (NF), good isolation and very high power handling capabilities with high integration in one single chip is possible.

Base station applications require the switches to handle a large power ranging from a few watts (W) up to more than 100 W. Actual switching solutions are obtained using PIN diodes, which are able to handle large powers. The major drawback is their static power consumption decreasing the overall energy efficiency of the system. GaN transistors may be a serious contender as they show high power handling, low static power consumption (essentially due to gate leakage) and also good linearity compared to MOS transistors.

On the other hand, SOI is the leading technology for switching applications. SOI MOS transistors offer really good low power performances with low Ron×Coff ($R_{on} \times C_{off}$ key figure of merit, FOM, of switches). SOI is a cost effective technology for RE system on chip (SOC) for applications up to 10 GHz without significant performance loss, and also reduces cross-talk, To attain such performances it is required to use advanced SOI technology with low voltage sustaining, which is the only drawback of the technology. The power handling capability can be enhanced by stacking multiple transistors, but is limited due to a saturation effect of stacked transistors: Zhu, Y., Klimashov, O., & Bartle, D. (2014, November), "Analytical model of voltage division inside stacked-FET switch", In 2014 Asia-Pacific Microwave Conference (pp. 750-752). IEEE.

According to an embodiment, GaN micro-transfer printing (μTP) on a SOI wafer enables monolithic designs with shorter interconnections, which can prevent losses and transitions between chips and substrates. Interconnections are provided directly between the two stacked chips with metal (e.g. thick copper) a.k.a. redistribution layer (RDL). When micro-transfer printing, one or more chiplets each containing one or more GaN devices is lifted from the native silicon substrate and placed on the SOI wafer.

Embodiments described herein can overcome SOI and GaN technology bottlenecks by combining them using micro-printing technology. In one embodiment, at least some of the existing problems are solved by a hybrid branch. It is composed of one or several stacked GaN p-Hemt (high electron mobility transistor) and stacked SOI MOS devices.

Figure 2A:
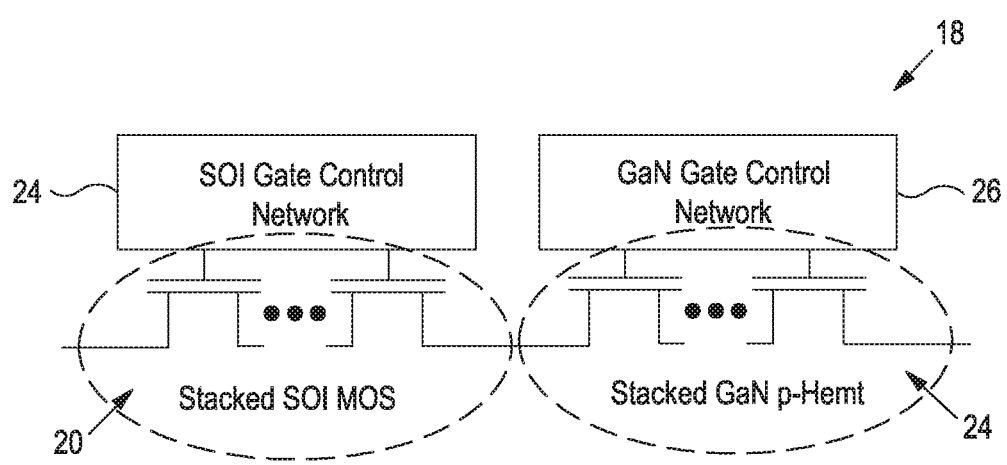
FIG. 2a is a schematic diagram of a monolithic hybrid switch branch according to an embodiment.

FIG. 2a shows a schematic diagram of a monolithic hybrid switch branch 18. The branch 18 has two or more stacked SOI MOS transistors 20 connected in series with two or more stacked GaN p-Hemts 22. The stacked SOI transistors 20 are controlled by a SOI gate control network 24 and the stacked GaN transistors are controlled by a GaN gate control network 26. In this configuration, the Coff is driven by the lowest value (SOI transistor) and the Ron is determined by the highest value (GaN transistor). It is possible to choose a trade-off while sizing both transistors to achieve specified isolation, return loss and insertion loss. The second parameter to take into account is the voltage distribution across the transistors. GaN impedance is much lower than that of a MOS transistor in the OFF state. It is necessary to use large MOS transistors to match the GaN impedance in the OFF state. This combination of GaN and SOI technologies can offer enhanced low power performance compared to GaN alone and allows improved high power handling compared to SOI alone.

Figure 2B:
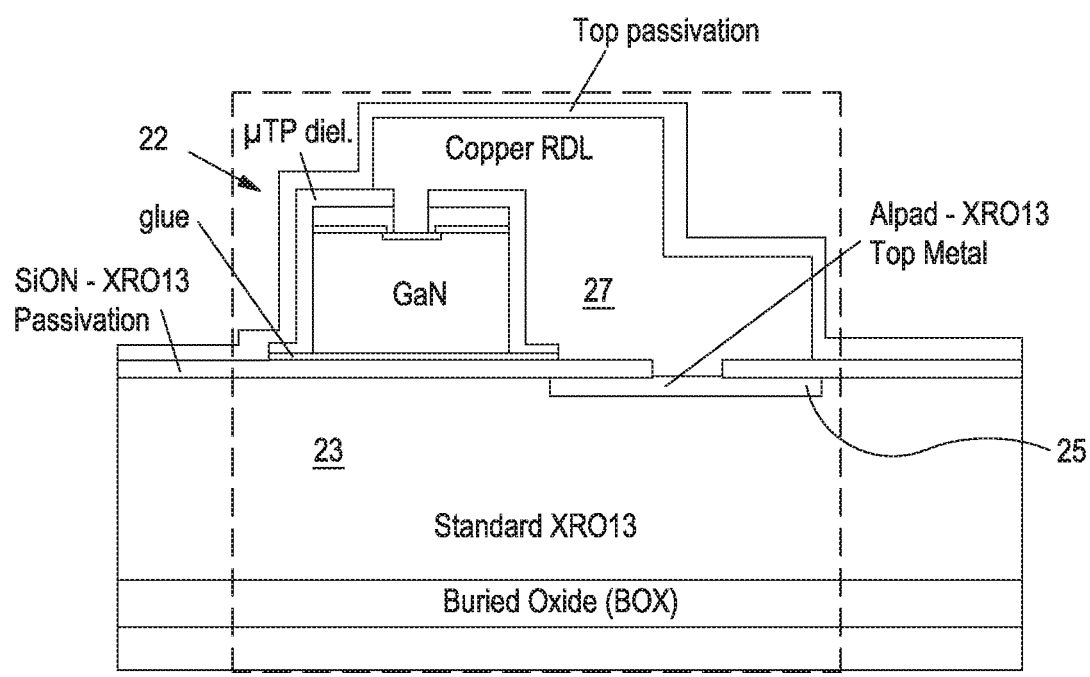
FIG. 2b is a schematic diagram of a cross-section of a semiconductor structure according to an embodiment, the structure having a GaN transistor micro-transfer printed onto a SOI wafer.

FIG. 2b is a schematic diagram of a cross-section of a semiconductor structure having a GaN transistor 22 micro-transfer printed onto an SOI wafer 23. The GaN transistor 22 is connected to the top metal 25 of the SOI 23 by a thick copper RDL 27.

Figure 3A:
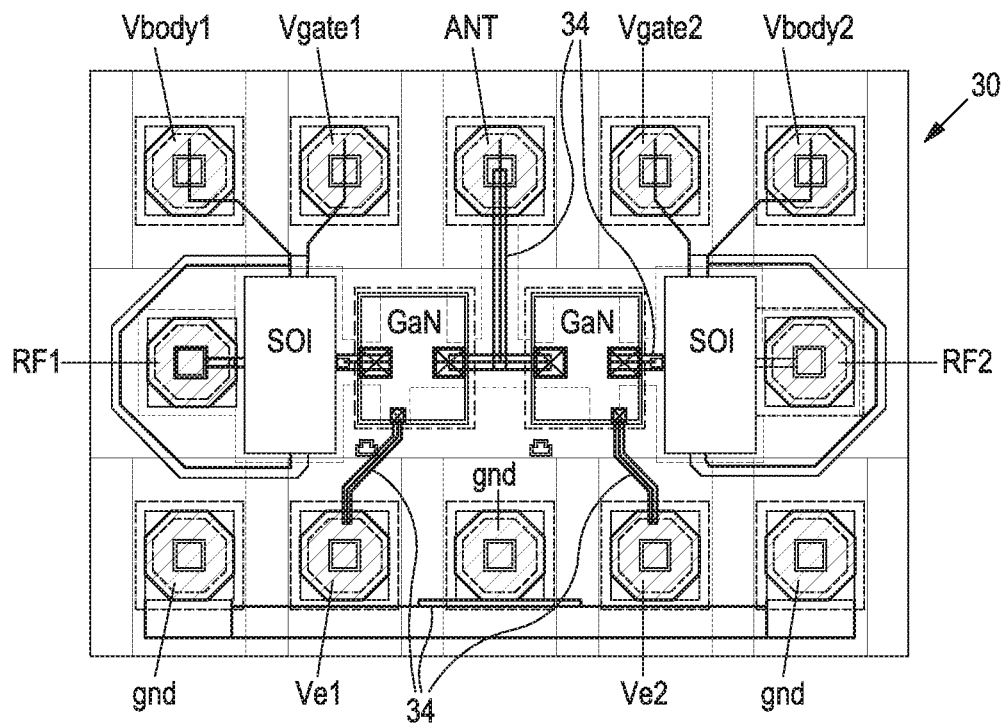
FIG. 3a shows the layout of an SPDT (Single Pole Double Throw) switch using hybrid branches according to an embodiment.
Figure 3B:
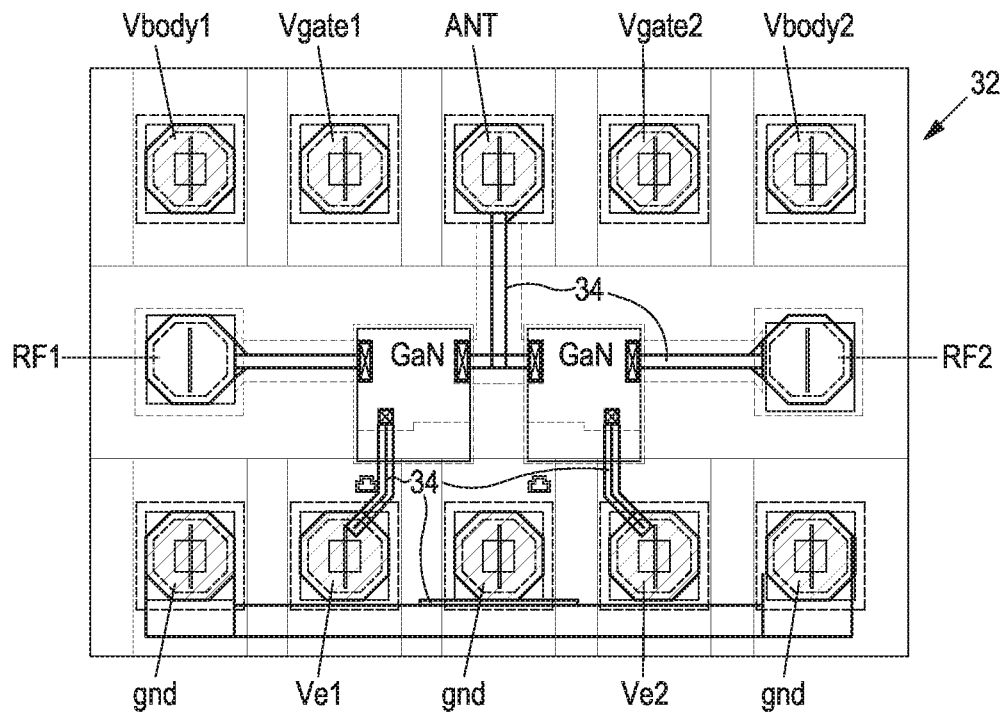
FIG. 3b shows the layout of an SPDT using pure GaN branches according to an embodiment.

FIG. 3a shows a top view of the layout of a GaN and SOI hybrid design 30 and FIG. 3b shows a similar top view of a design 32 purely using GaN p-Hemt (still micro-printed on an SOI wafer) for comparison. Both layouts represent single pole double throw (SPDT) switches. The operating frequency band of the designs ranges from DC to 6 GHz. The power handling required is 47 dBm and sizes are optimized to achieve the lowest insertion loss at 6 GHz. The top thick copper layer 34 connects the GaN transistors to SOI components.

The simulated performances of both SPDT designs are shown in table 1. The performances are taken at chip level and no de-embedding was applied. Interconnections are simulated using Momentum electromagnetic simulator from Keysight while transistors are either taken as an electrical model for the GaN transistors or an extracted view for the SOI transistors. Except for return losses, the hybrid combination exhibits better performance across all considered operational bandwidths. Isolations are enhanced by an average 5 dB.

TABLE 1

| | Simulated performance of SPDT designs | | | | | | | |
|---|---|---|---|---|---|---|---|---|
| | RL (dB) | | IL (dB) | | Iso AtoRF (dB) | | Iso RFtoRF (dB) | |
| Freq. (GHz) | Pure GaN | Hybrid | Pure GaN | Hybrid | Pure GaN | Hybrid | Pure GaN | Hybrid |
| 1 | 43.1 | 32.8 | 0.47 | 0.49 | 24.3 | 29.6 | 24.8 | 30.1 |
| 3 | 35.5 | 25.9 | 0.58 | 0.58 | 16.2 | 21.2 | 16.7 | 21.7 |
| 6 | 27.6 | 19.9 | 0.94 | 0.76 | 10.5 | 15.7 | 11.1 | 16 |

Figure 4:
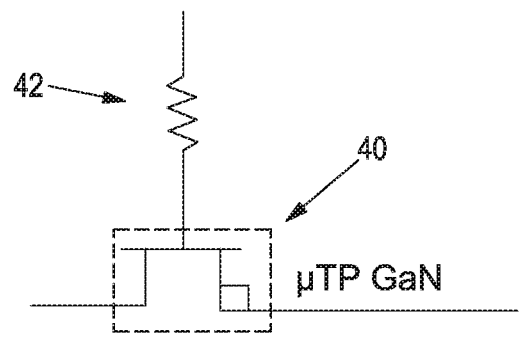
FIG. 4 is a circuit diagram of a semiconductor structure according to an embodiment.

FIGS. 4 to 9 show circuit diagrams of embodiments described herein. Similar or corresponding features of embodiments in different figures have been given the same reference numerals to aid understanding. FIG. 4 shows a µTP (i.e. micro transfer printed) GaN transistor 40 (i.e. a GaN transistor micro-printed onto a SOI wafer) with a resistor 42 connected to the gate of the transistor 40. The resistor 42 is formed on the SOI and/or on the µTP GaN chiplet. The resistor formed on the SOI wafer can be connected to the GaN transistor 40, after micro-printing, by a thick copper redistribution layer (RDL).

Figure 5:
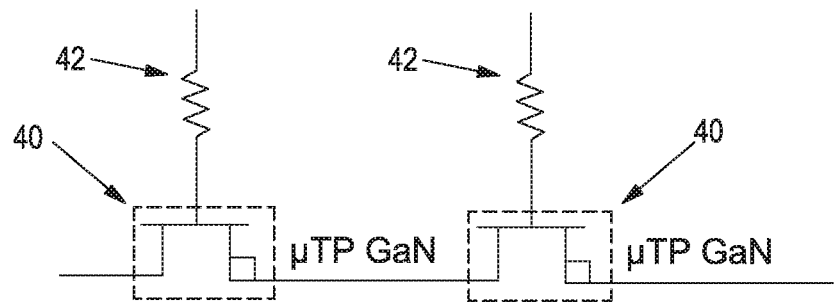
FIG. 5 is a circuit diagram of a semiconductor structure according to another embodiment.

FIG. 5 shows two µTP GaN transistors 40 in series. Both transistors 40 are connected to their respective resistors 42 on the SOI wafer/die ('die' referring to the diced chip after cutting the wafer). Each resistor 42 may have the same or different resistances. Both transistors 40 are preferably transferred to the SOI wafer in the same process step.

Having two or more GaN transistors in series in a switching branch on an SOI wafer/die can improve the switching performance by increasing the maximum voltage that can be handled. Each µTP GaN transistor 40 should be able to handle a peak voltage of about 50 V. Two transistors in series would ideally support a 100 V RF voltage which corresponds to 50 dBm/100 W (with a 50Ω load). It may be beneficial to have some margin on the power handling, and thus one or several further transistors can be added in series to decrease the drain to source voltage across the first two transistors. The power handling can be increased by stacking more GaN transistors.

Figure 6:
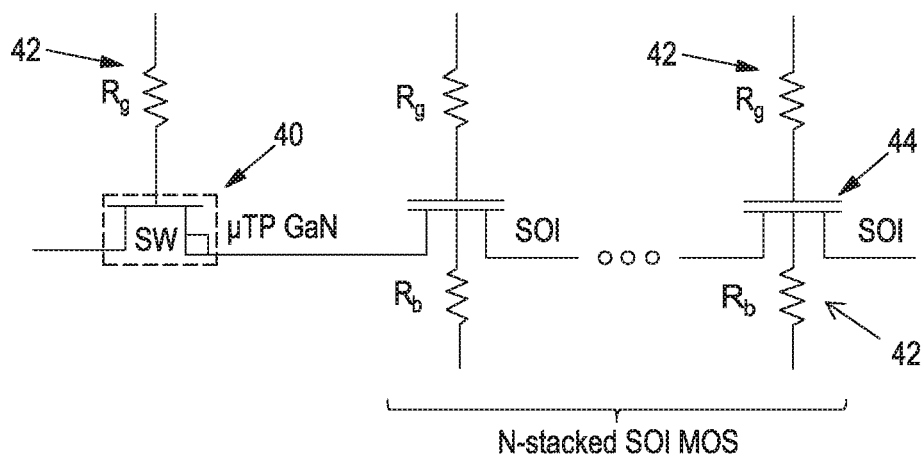
FIG. 6 is a circuit diagram of a semiconductor structure according to another embodiment.

FIG. 6 shows a µTP GaN transistor 40 in series with one or more SOI transistors 44. The gate of the GaN transistor 40 is connected to a resistor 42 and the gates and the bodies of the SOI transistors are connected to their respective resistors 42. The resistors 42 connected to the SOI transistors 44 are made on SOI. The resistor 42 connected to the GaN transistor 40 could be made in either GaN or SOI. The GaN transistor 40 can be connected to the SOI resistor 42 and to the SOI transistors 44 by a thick copper RDL.

Figure 7:
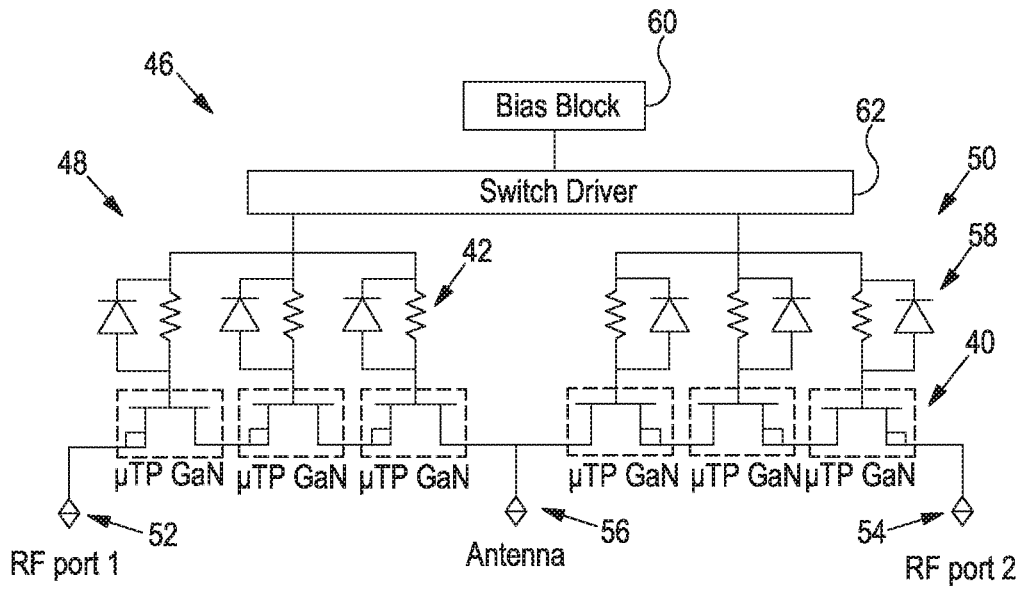
FIG. 7 is a circuit diagram of an SPDT switch according to an embodiment.

FIG. 7 shows a SPDT switch 46 circuit diagram according to an embodiment. The two switching branches 48 and 50 are connected to RF port 1 52 and RF port 2 54 respectively and to an antenna 56. Each branch comprises three µTP GaN transistors 40 in series.

All the gates are connected to a resistor 42 in parallel with a diode 58. The purpose of the resistor 42 is to avoid any RF leakage from the drain or source to the gate, as well as having a floating RF node at the gate so the gate power level moves in sync with the drain or source. The purpose of the diode 58 is to give a path to the µTP GaN gate DC current. Without this diode 58, the DC gate current would create a voltage drop across the gate resistor Rg and the voltage actually applied to the gate would be the DC bias modified by this voltage drop. This could become a problem in the OFF state, where the DC gate current is not negligible. The gate voltage can be modified significantly by this voltage drop, so the transistors 40 would be less open than expected.

All the gates are biased using a bias block 60, which delivers a negative voltage to turn the switch OFF. The µTP GaN switches are normally ON, thus applying the ground on the gate is sufficient to turn it ON. A switch driver 62 is used to deliver the right DC voltage on the right gate. Other architectures could have 1, 3 or 4 arms/branches etc connected to respective RF ports.

Figure 8:
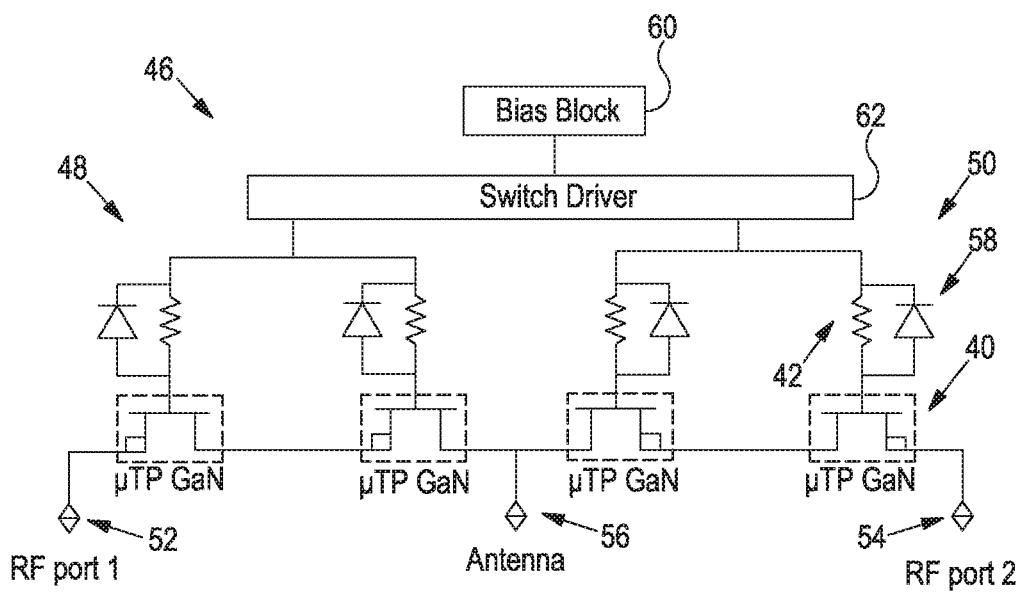
FIG. 8 is a circuit diagram of an SPDT switch according to another embodiment.

FIG. 8 shows a circuit diagram, similar to that in FIG. 7, but with only two µTP GaN transistors 40 in each switching branch 48 and 50. Each gate of the transistors 40 is connected to a resistor 42 in parallel with a diode 58.

Figure 9:
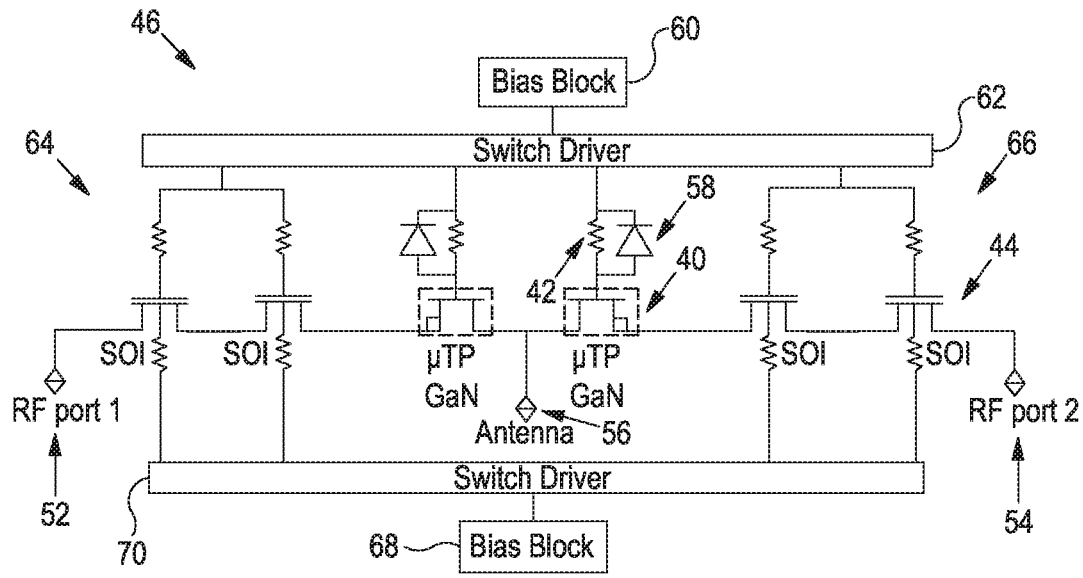
FIG. 9 is a circuit diagram of an SPDT switch according to an embodiment with hybrid switching branches.
Figure 10:
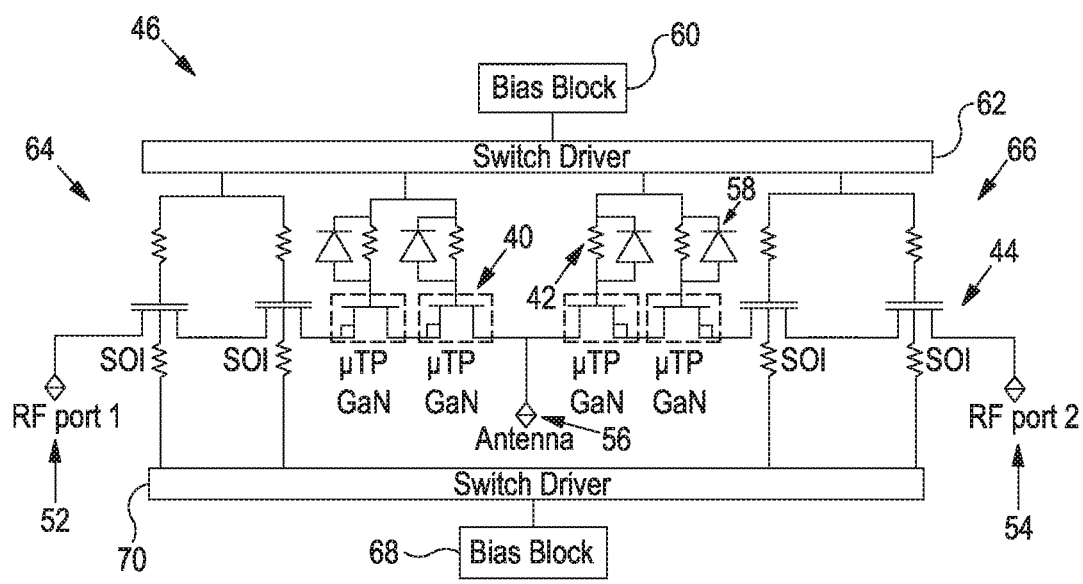
FIG. 10 is a circuit diagram of an SPDT switch according to another embodiment with hybrid switching branches.

FIG. 9 shows a circuit diagram of an SPDT switch 46 with hybrid branches 64 and 66. Each branch comprises one µTP GaN transistor 40 and stacked SOI transistors 44. A second bias block 68 and switch driver 70 are used to control the SOI transistors 44, although in other embodiments a single bias block and switch driver can be used to control all the GaN transistors 40 and the SOI transistors 44. FIG. 10 shows a circuit diagram of a similar SPDT switch 46, but with two µTP GaN transistors 40 in series in each branch 64 and 66.

Although each of FIGS. 7 to 10 illustrates an architecture with two switching branches, the designs can be extended to comprise further switching branches. For example, an embodiment can comprise four RF ports, each connected to a switching branch comprising one or more µTP GaN transistors. The architecture can be generalized to an NPMT switch (with N antennas and M RF ports, i.e. N Poles and M Throws).

One embodiment comprises a Low Noise Amplifier (LNA) using a heterogeneous integration of GaN technology with SOI technology to enhance the linearity of the circuit.

Figure 11:
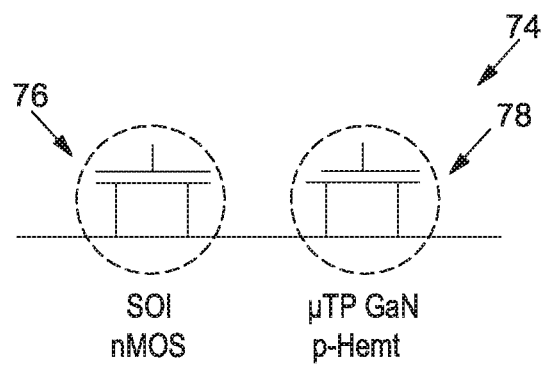
FIG. 11 shows a schematic diagram of an amplifying cell according to an embodiment.

FIG. 11 shows a cell 74 that can be used in an LNA according to an embodiment for amplifying an RF signal. The cell 74 comprises a common source SOI nMOS transistor 76 in series with a common gate micro-printed GaN HEMT 78 forming a cascode structure (having a common source transistor directly in series with a common gate transistor).

An advantage of this topology is the improvement of the overall linearity of the SOI technology using a discrete GaN HEMT. These µTP GaN transistors are able to handle a large supply voltage which is the main weakness of silicon-based transistors. It enables the structure to develop larger output power and therefore larger IP3 (FOM used to characterize LNA linearity). Furthermore, the GaN HEMT is used as a cascode because the IP3 of a system composed of n-cascaded stages is imposed by the last stage as shown in Equation 1.

$$IIP_3 = \sqrt{\frac{1}{\frac{1}{IIP_{3,1}^2} + \frac{G_1^2}{IIP_{3,2}^2} + \frac{G_1^2 \cdot G_2^2}{IIP_{3,3}^2} \ldots + \frac{G_1^2 \cdot G_2^2 \ldots \cdot G_{n-1}^2}{IIP_{3,n}^2}}} \quad (1)$$

For these reasons, using the GaN as the cascode transistor will improve the LNA linearity performances (OIP3, Output third order interception point) compared to using a full SOI LNA.

Another reason to use this heterogeneous cell 74 is to provide low continuous power consumption compared to pure GaN designs. The SOI technology provides low leakage as well as a low current MOS transistor, which can be particularly advantageous for this application.

Figure 12:
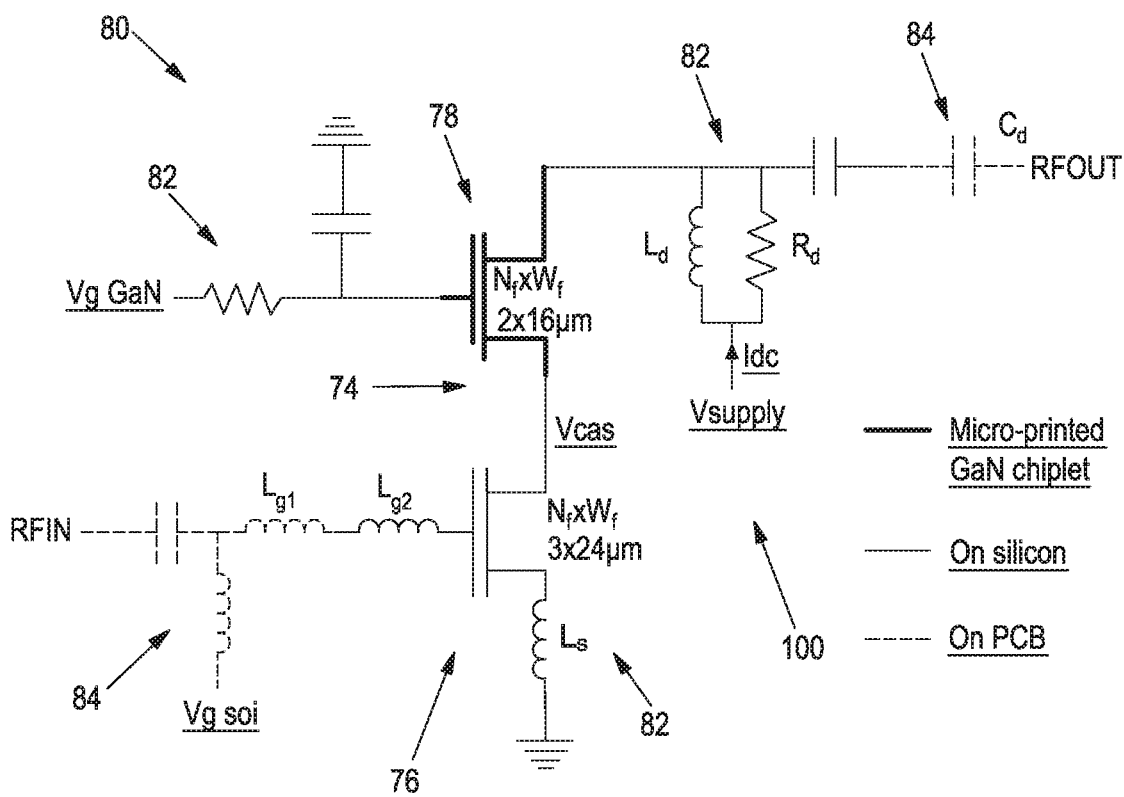
FIG. 12 is a circuit diagram comprising a Low Noise Amplifier (LNA) according to an embodiment.

An LNA design 80 is shown in FIG. 12. It uses a degenerated LNA architecture including the cell 74 with the SOI transistor 76 and µTP GaN transistor 78 shown in FIG. 11 used as an amplifier cell. The different passive and active parts are implemented on PCB 84, formed on SOI 82 (i.e. native SOI components), or micro-printed (i.e. the µTP GaN transistor 78). The SOI chip can be flip-chipped on a PCB for characterization purposes.

The LNA can satisfy the 5G NR (sub 6 GHz) standard. The operating band is from 5.9 GHz to 7.1 GHz and corresponds to a US unlicensed band. The supply voltage is set to 5.5V and corresponds to typical base station voltage. The common source transistor gate voltage is set to achieve the IP3 specification of 28 dBm across the band. The common gate bias voltage is then adjusted so the nMOS drain voltage is set to 1.2 V, which is its typical value.

Figure 13:
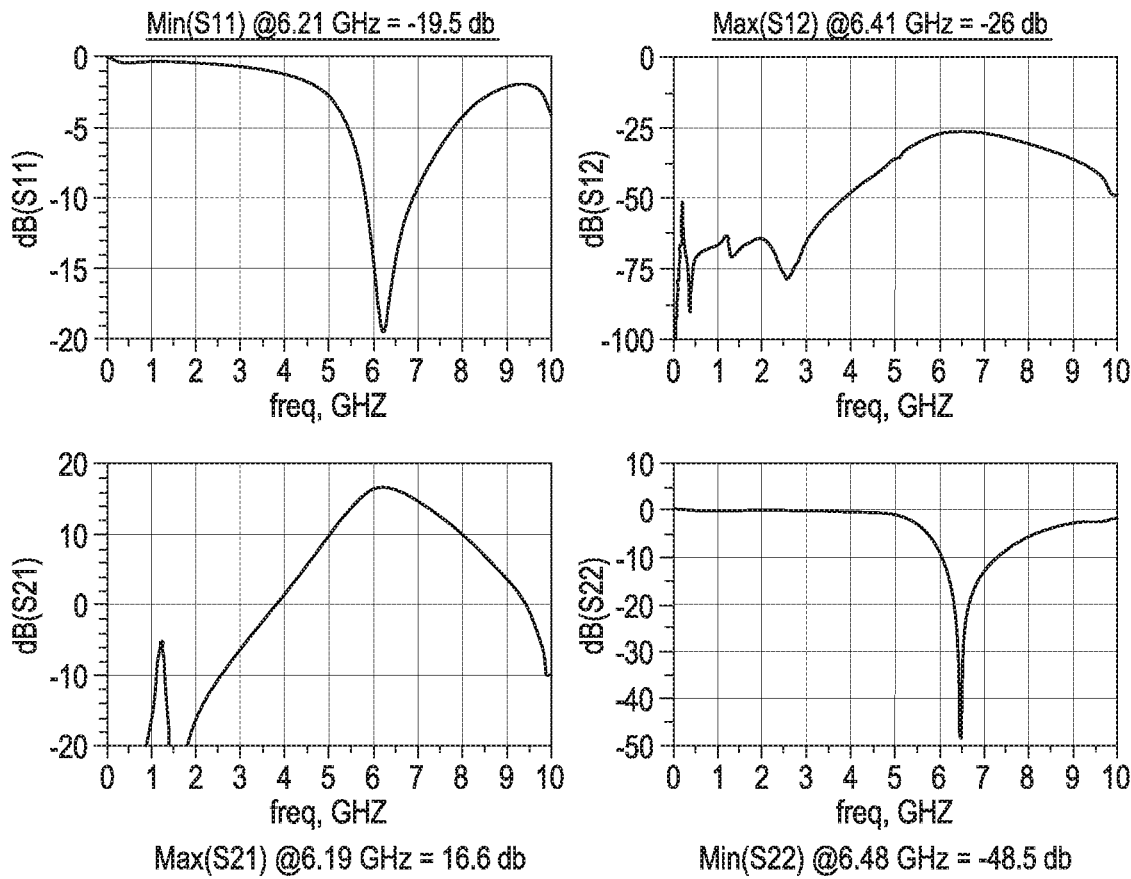
FIG. 13 shows graphs with simulated 2 port S-parameters of an LNA according to an embodiment plotted against frequency.
Figure 14:
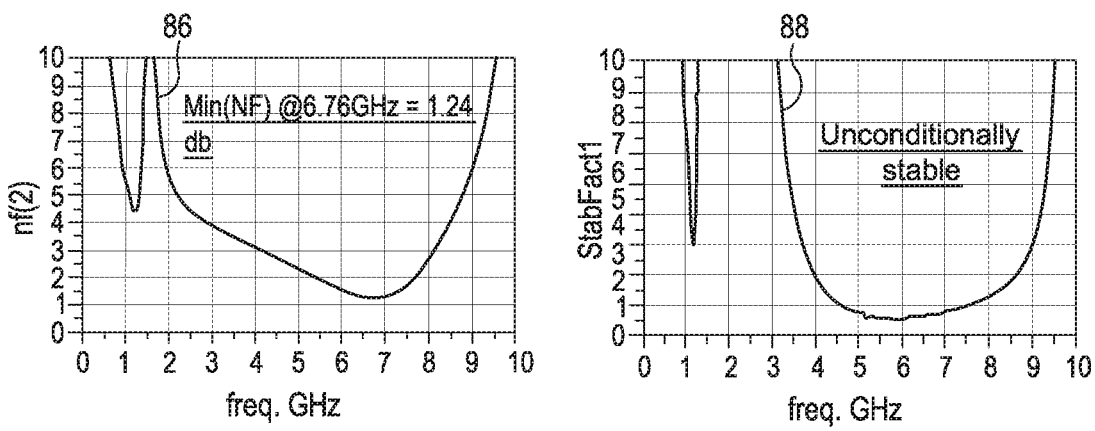
FIG. 14 shows the simulated noise figure (NF) on the left and K factor on the right of an LNA according to the embodiment plotted against frequency.

The circuit was simulated and the S-parameter simulation results are shown in FIG. 13 and the NF 86 and K factor 88 in FIG. 14. The continuous power consumption was 165 mW. The input and output are well matched to 50Ω in the band. The amplifier exhibits 16.6 dB of gain at maximum in the band and a minimum isolation of −26 dB. The amplifier is unconditionally stable up to 10 GHz. NF is lower than 1.7 dB in the band with a minimum of 1.24 dB at 6.8 GHz.

Figure 15:
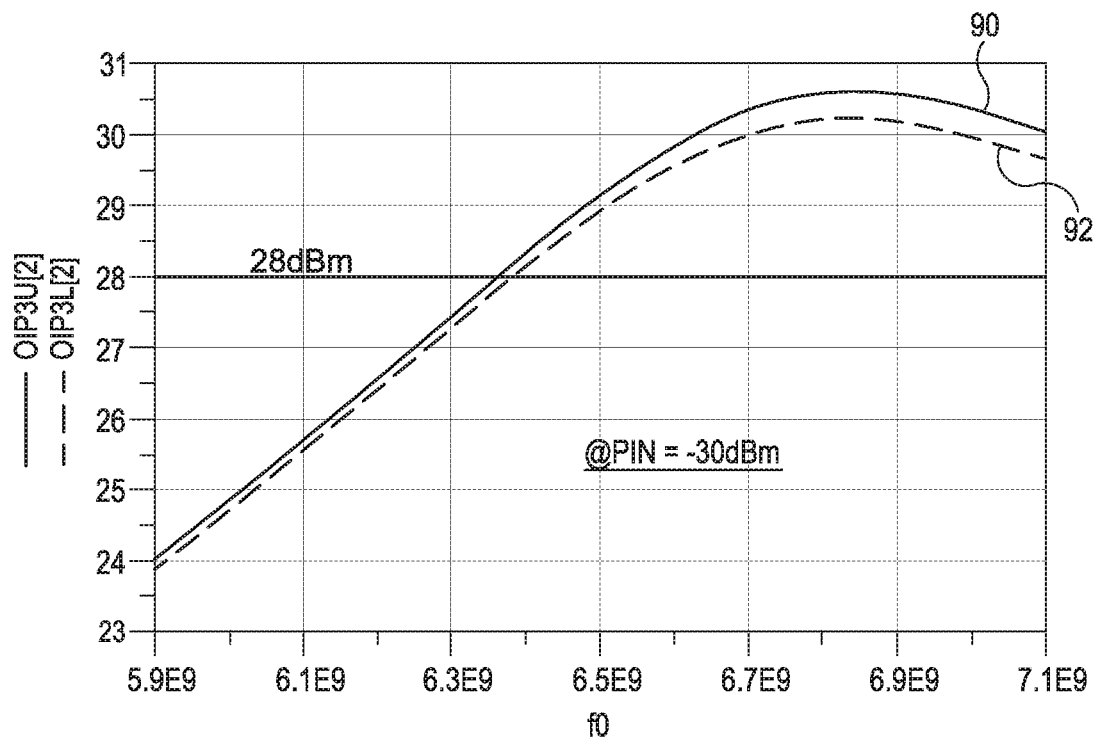
FIG. 15 shows the upper and lower OIP3 as a function of the central frequency of an LNA according to the embodiment.

The OIP3 simulated results are given in FIG. 15. The power of the two input fundamental tones was set to −30 dBm with a 1 MHz tone separation. The upper OIP3 90 and lower OIP3 92 are above 28 dBm from 6.35 GHz up to 7.1 GHz. The maximum OIP3 is 30.6 dBm at 6.8 GHz.

All the performances as well as the specifications are summarized in Table 2 and given at 6.5 GHz, which is at the middle of the band.

TABLE 2

DC, small signal (SP), and noise (NF) performance summary

|  | Heterogeneous LNA | Specification | Unit |
|---|---|---|---|
| DC power | 110 | 165 | mW |
| Frequency | 5.9-7.1 | 5.9-7.1 | GHz |
| Gain | 16.2 | >15 | dB |
| NF | 1.28 | 1.7 | dB |
| S11 | −14.5 | −10 | dB |
| S22 | −41 | −10 | dB |
| S12 | −26 | −20 | dB |
| OIP3 | 30.6 | 28 | dBm |

Table 3 compares the LNA design with existing products. Performance is equivalent except for the power consumption which is reduced by a factor 3 compared to analog devices and a factor 5 compared to Qorvo [3]. The size of the chip is not representative as it is a demonstrator.

TABLE 3

Comparison with existing devices

| Product ref. | Technology | Freq (GHz) | Supply (V) | Idc (mA) | Gain (dB) | Product ref. | Technology | OIP3 (dBm) | NF (dB) | S11 (dB) | S22 (dB) | Area (mm²) |
|---|---|---|---|---|---|---|---|---|---|---|---|---|
| Analog devices HMC392A [2] | GaAs | 3.5-7 | 5 | 59 | 17.2 | Analog devices HMC392A [2] | GaAs | 32.5 | 1.7 | 12 | 18 | 1.3 |
| Qorvo TGA2611 [3] | GaN on SiC TQGaN25 | 2-6 | 10 | 110 | 25 | Qorvo TGA2611 [3] | GaN on SiC TQGaN25 | 32 | 1.5 | >10 | >10 | 3.15 |
| Standard LNA | 0.1 µm GaN on XR013 | 5.9-7.1 | 5.5 | 20 | 16.2 | Standard LNA | 0.1 µm GaN on XR013 | 30.61† | 1.28 | 14.5 | 41.3 | 2.48 |

[2] HMC982A-Die: GaAs MMIC Low Noise Amplifier, 3.5-7.0 GHz Data Sheet. https://www.analog.com/en/products/hmc392a-die.html#product-documentation

[3] Preliminary Product Data Sheet TGA2611 2-6 GHz GaN LNA, https://www.qorvo.com/products/p/TGA2611

The micro-printing technique enables the co-integration of different technologies on die level. The performance of the circuit can be enhanced whilst maintaining its small area.

Figure 16:
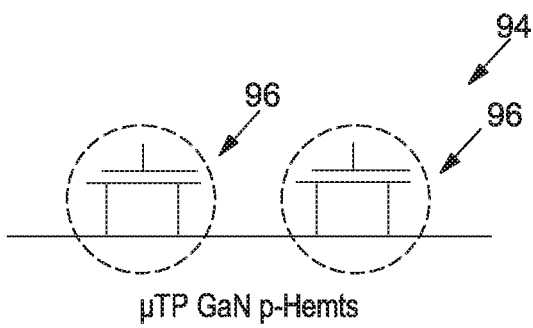
FIG. 16 is a circuit diagram of a semiconductor structure according to an embodiment.
Figure 17:
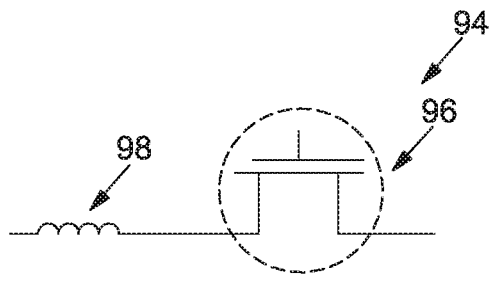
FIG. 17 is a circuit diagram of a semiconductor structure according to another embodiment.

FIG. 16 shows a cell 94 for an LNA or a PA with two µTP GaN p-Hemts 96 in series on an SOI wafer/die. The µTP GaN transistors could be on the same chiplet or on separate chiplets. FIG. 17 shows a cell 94 for an LNA with a µTP GaN p-Hemt 96 with an inductor 98 connected to its source. The inductor 98 is formed on the SOI wafer and connected to the GaN HEMT with RDL.

Figure 18:
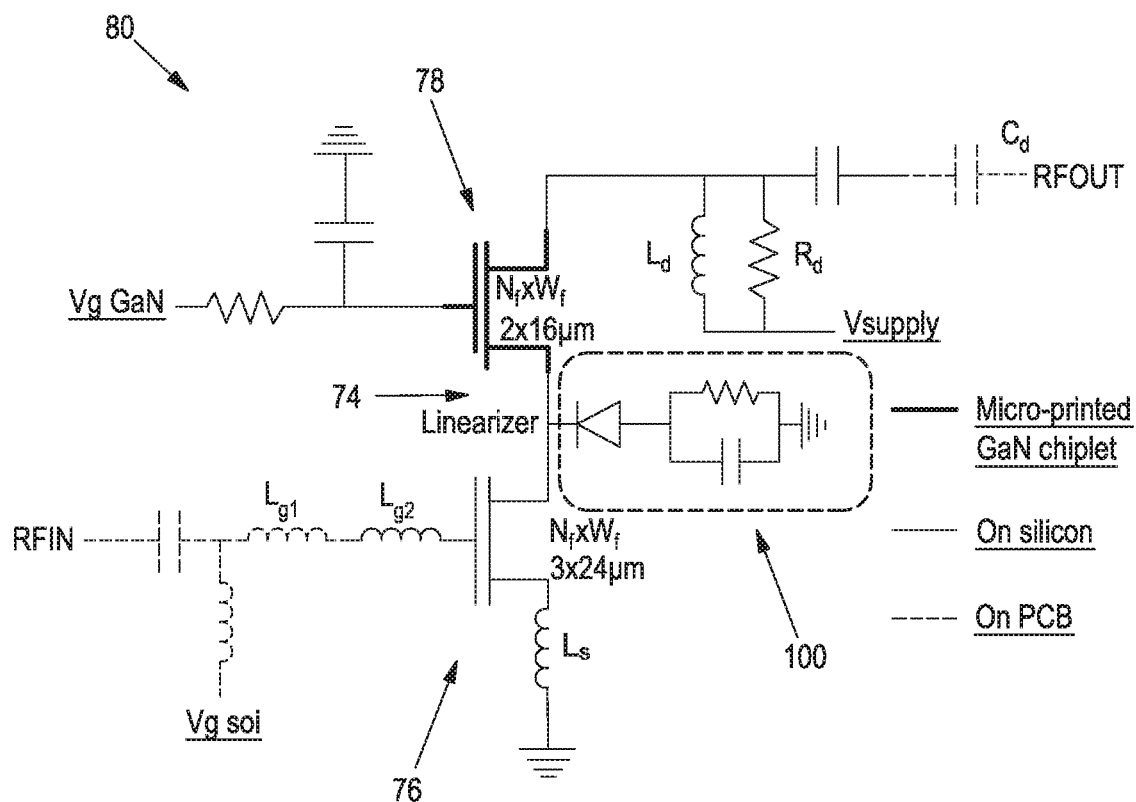
FIG. 18 is a circuit diagram of an LNA with a cascode structure according to an embodiment.

FIG. 18 shows a circuit diagram of an LNA design 80 comprising a cascode cell 74 comprising an SOI transistor 76 in series with a µTP GaN p-Hemt 78 and a linearizer 100 between both transistors to improve linearity. The diode in series with the capacitance in parallel with the resistor permits to a non-linear current to be generated at the third order intermodulation frequency to cancel the MOS drain component at the same frequency. The linearizer 100 is formed on the SOI wafer.

Figure 19:
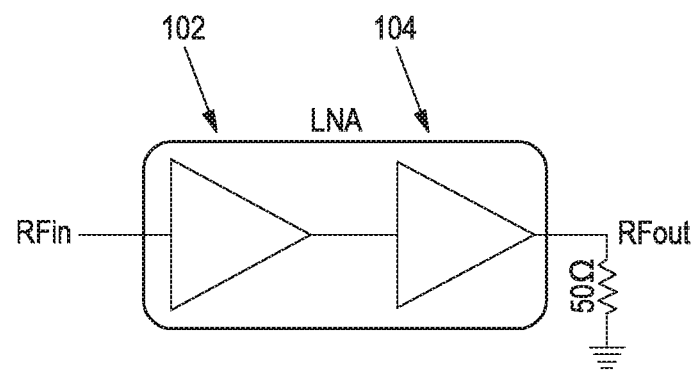
FIG. 19 is schematic diagram of a two stage amplifier according to an embodiment.

Another LNA design for satisfying the 5G millimeter wave standard is described. It is designed using two stages 102 and 104 in cascade as shown in FIG. 19. The IP3 of the overall system when cascading n stages is imposed by the last stage as expressed by Equation 1.

Thus, using the GaN for the second stage LNA 104 will improve the LNA linearity performance (IIP3 and CP1) compared to using full SOI LNA. For the first stage 102, an SOI transistor can be used to benefit from its good noise performance.

To evaluate the advantage of using the GaN in the second stage, two circuits were designed at 28 GHz:

The first one using full SOI architecture for the first and second stages.

For the second design, a GaN transistor was employed for the second stage.

Figure 20A:
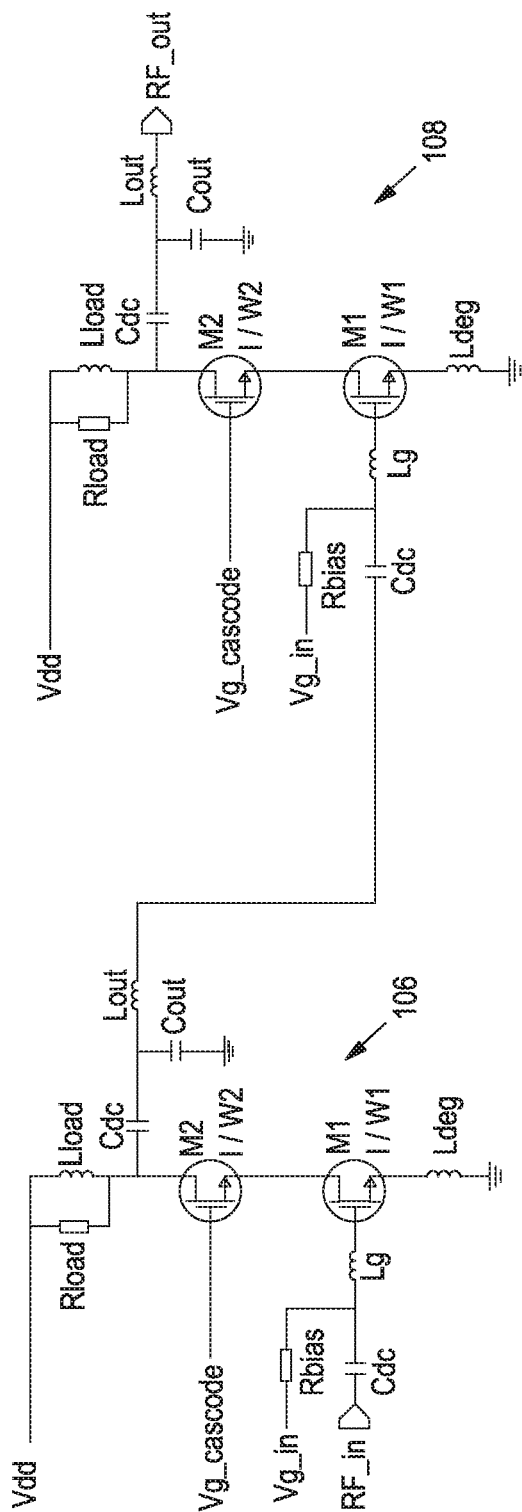
FIG. 20a is an electrical schematic of a two stage amplifier.
Figure 20B:
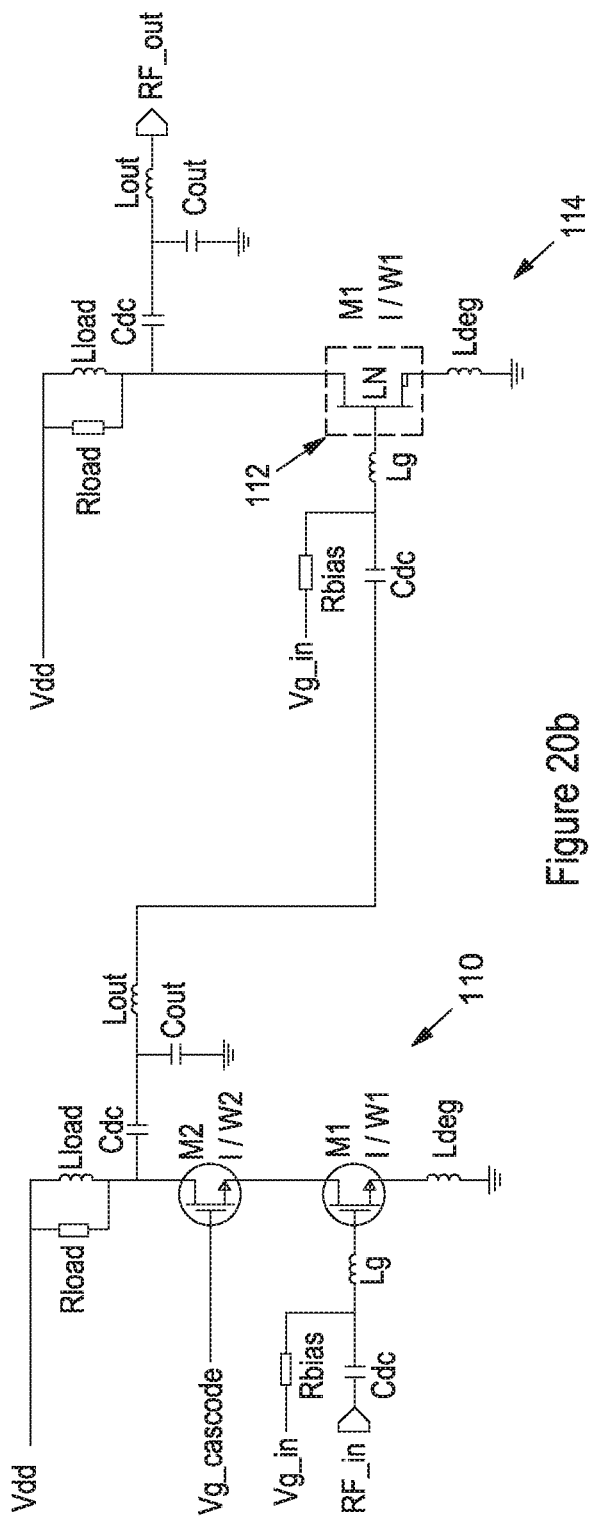
FIG. 20b is an electrical schematic of a two stage amplifier according to an embodiment using micro-transfer printed GaN transistors for the second stage.

The schematics of the two LNAs is shown in FIGS. 20*a* and 20*b* respectively. In FIG. 20*a* two stages 106 and 108 mounted in cascode were cascaded for the fully SOI circuit. Concerning the heterogeneous LNA in FIG. 20*b*, the first stage 110 is in cascode. As the nominal drain source voltage for the GaN transistor 112 should be higher than the SOI transistors, the second stage 114 is designed using common source architecture. The purpose is to use the same power supply as the first stage 110.

The simulated DC, small signal (SP) and noise (NF) performances of the two LNA versions are summarized in Table 4. The performance is similar between the two versions and both of them satisfy the specification (i.e. the 5G standard requirements).

TABLE 4

DC, small signal (SP) and noise (NF) performance of two LNA versions

| | Fully SOI LNA | Heterogenous LNA | Specification | Unit |
|---|---|---|---|---|
| DC power | 29.5 (2.4 V * 12.3 mA) | 29.5 (2.4 V * 12.3 mA) | 30 | mW |
| Frequency | 27.5-30.5 | 27.5-30.5 | 27.5-30.5 | GHz |
| Gain @ 29 G | 16.3 | 15.2 | 15 | dB |
| Max Gain | 17.2 | 16.3 | 15 | dB |
| NF @ 29 G | 3.7 | 3.4 | 4 | dB |
| S11 | −17.7 | −15 | −10 | dB |
| S22 | −13.9 | −23.7 | −10 | dB |
| S12 | −46.1 | −20.9 | −20 | dB |
| Kf | >1.4 | >1 | >1 | |

Two figures of merit are used to quantify the linearity of circuits:

Input compression point CP1.

Input third intercept point IP3.

The use of the GaN transistor 112 in the second stage 114 improves these parameters by almost 10 dB. The simulated CP1 of the heterogeneous solution is about −13 dBm versus −21 dBm for the full SOI LNA. Concerning the IP3, the simulation showed 6 dBm for the heterogeneous LNA and −10 dBm for the full SOI version.

The designed LNA with the micro-printed GaN transistor has been benchmarked with other LNAs designed with different technologies which present high integration capabilities (CMOS and SiGe). As can be seen in Table 5, the LNA described herein presents higher linearity thanks to the use of the GaN on SOI transistor with comparable performances of the other parameters.

TABLE 5

LNA benchmarking

| | Unit | [4] | [5] | [6] | [7] | LNA embodiment |
|---|---|---|---|---|---|---|
| Process | | 130 nm CMOS | 40 nm Bulk CMOS | 90 nm CMOS | 0.25 µm SiGe | GaN/ 130 nm SOI |
| Topology | | 3-stage cascode | 3-stage | 2-stage cascode | 3-stages | 2-stages |
| Frequency | GHz | 27.2 | 27.1 | 28.5 | 29 | 29 |
| Pdc | mW | 24 | 31.4 | 16.25 | 134 | 29.5 |
| Gain | dB | 20 | 27.1 | 20 | 26.4 | 15.2 |
| NF | dB | 5.2-7.5 | 3.3-4.3 | 2.9-4.2 | 2.1-3.5 | 3.4 |
| CP1 | dBm | — | −21.6 | −17 | −14.9 | −13 |
| IIP3 | dBm | — | −12.6 | −7.5 | −5 | 6 |

[4] J. Luo, and all "A 28 GHz LNA using defected ground structure for 5G application". Microw Opt Technol Lett. 2018; 60:1067-1318.

[5] M. Elkholy, and all "A Wideband Variable Gain LNA With High OIP3 for 5G Using 40-nm Bulk CMOS". 2017 IEEE MICROWAVE AND WIRELESS COMPONENTS LETTERS.

[6] E. Adabi, B. Heydari, M. Bohsali, and A. M. Niknejad, "30 GHz CMOS low noise amplifier," in Proc. IEEE Radio Freq. Integr. Circuits (RFIC) Symp., June 2007, pp. 625-628.

[7] Q. Ma, D. M. W. Leenaerts, and P. G. M. Baltus, "Silicon-based truetime-delay phased-array front-ends at Ka-band," IEEE Trans. Microw. Theory Techn., vol. 63, no. 9, pp. 2942-2952, September 2015.

Figure 21:
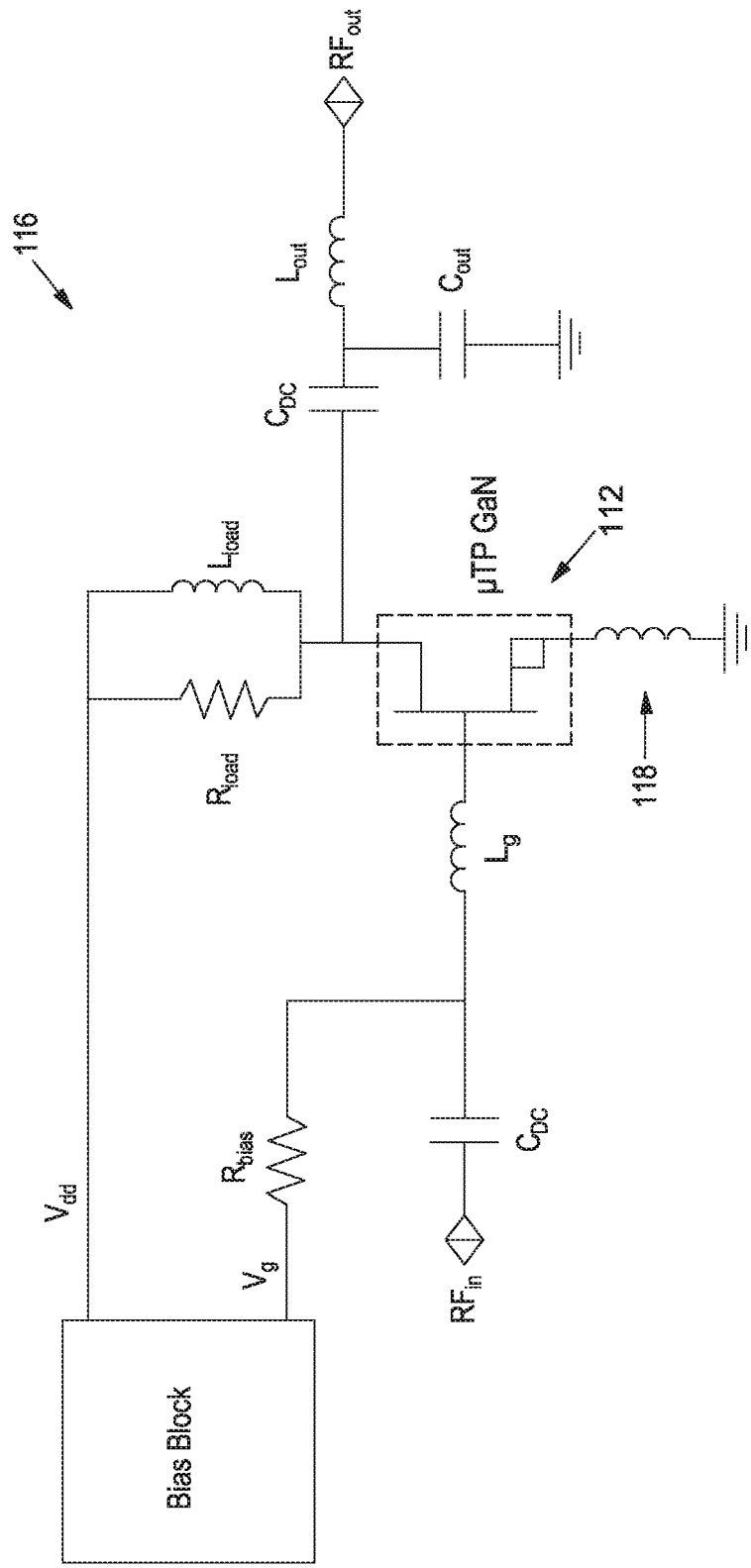
FIG. 21 is a circuit diagram of an LNA according to an embodiment using micro-transfer printed GaN transistors.

FIG. 21 shows a circuit diagram of an LNA 116 according to an embodiment. The LNA 116 comprises a µTP GaN transistor 112 on SOI connected to other SOI components. The source of the GaN transistor is connected to an inductor 118 formed on the SOI wafer.

Figure 22:
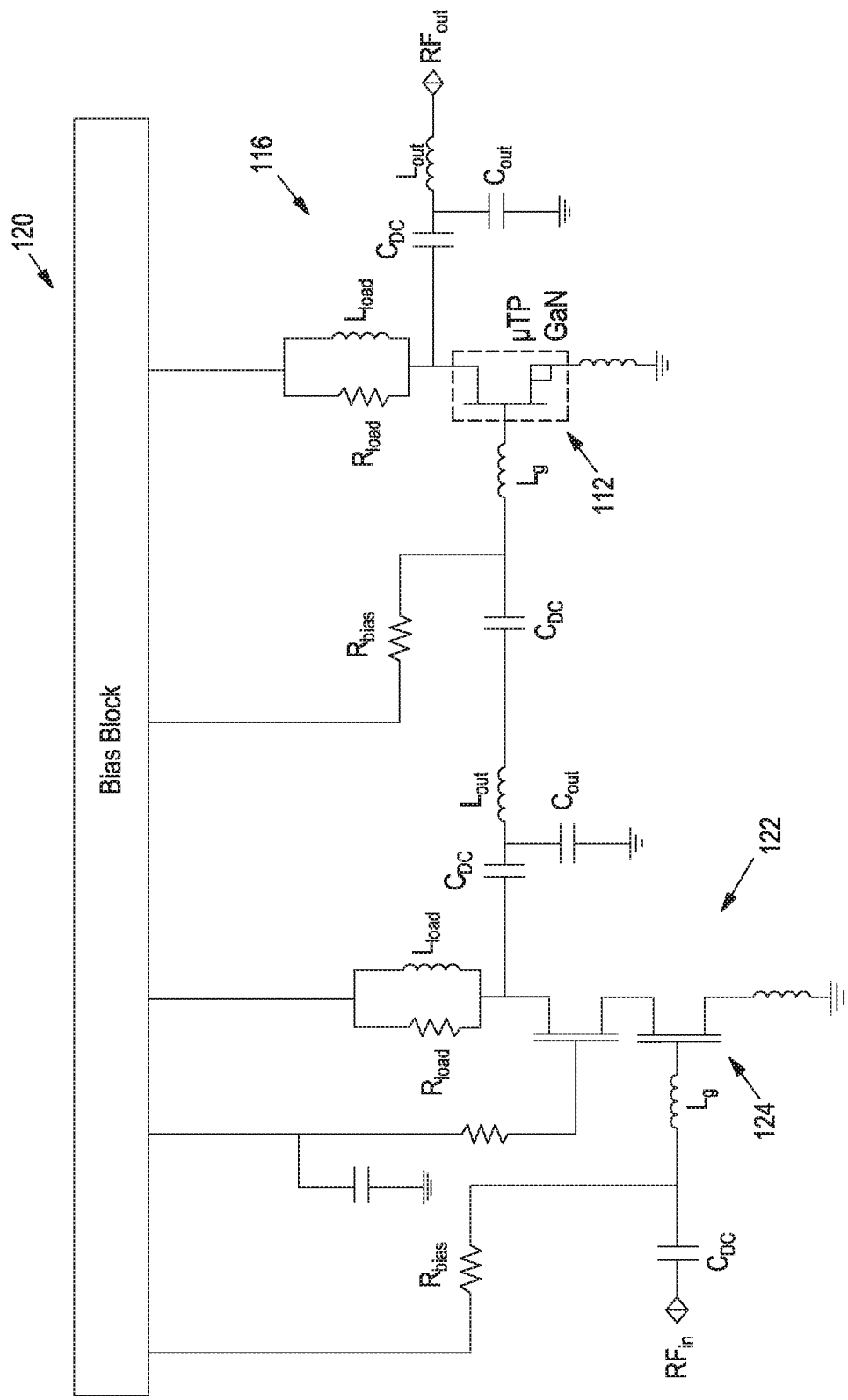
FIG. 22 is a circuit diagram of a two stage LNA according to an embodiment using micro-transfer printed GaN transistors for the second stage.

FIG. 22 shows a circuit diagram of a two stage amplifier 120 comprising two connected LNAs 116 and 122. The first LNA 122 (the first stage) comprises two SOI transistors 124 in a cascade structure and the second LNA 116 (the second stage) comprises a µTP GaN transistor 112 in common source. The second LNA 116 is equivalent to the one shown in FIG. 21. A single bias block 126 formed on the SOI wafer is used to power both stages 116 and 122. Both stages 116 and 122 preferably use the same power supply.

Figure 23:
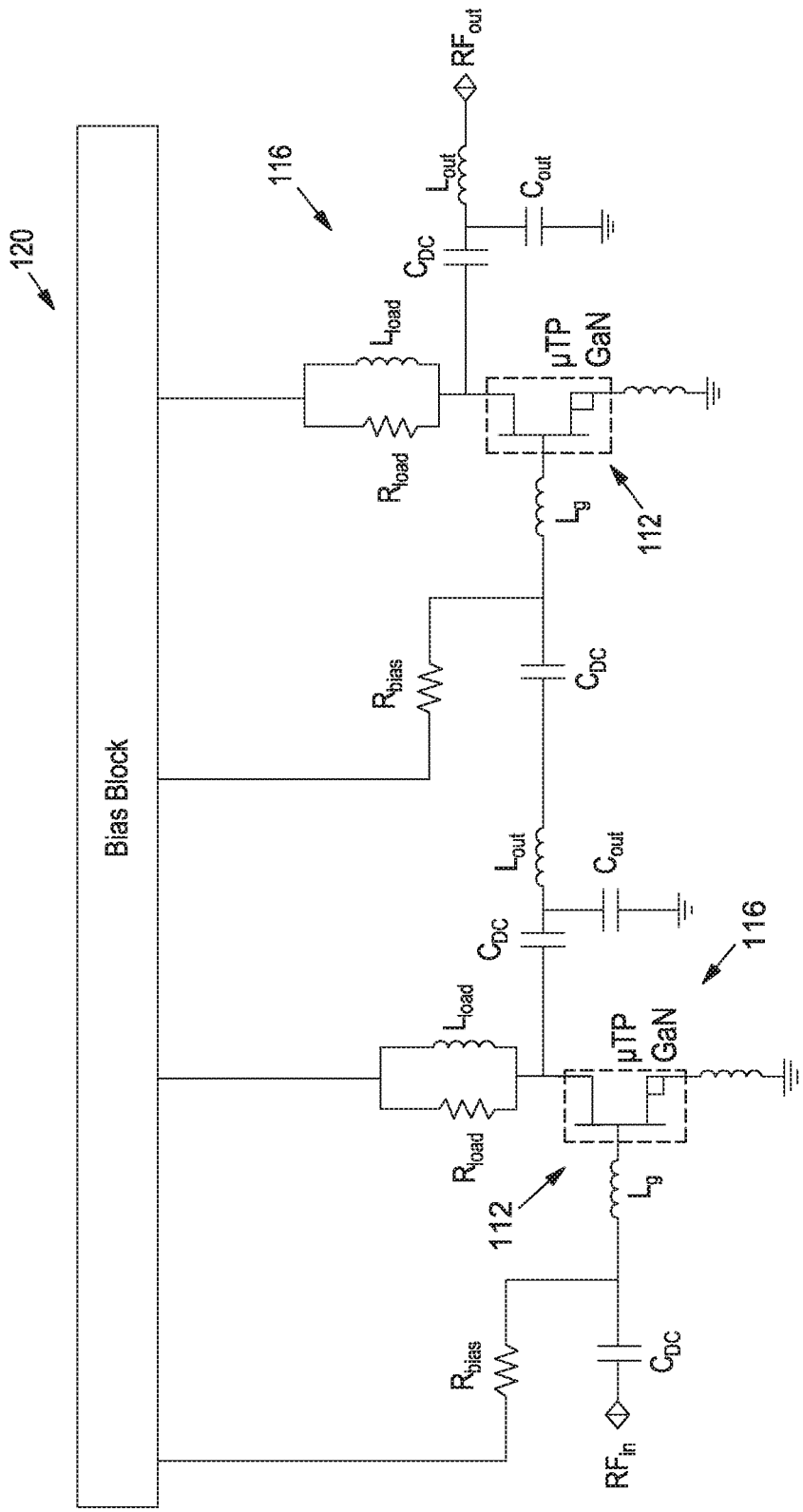
FIG. 23 is a circuit diagram of a two stage LNA according to another embodiment using micro-transfer printed GaN transistors for the first and second stage.

FIG. 23 shows a circuit diagram of another two stage amplifier 120 comprising two connected LNAs 116 on an SOI wafer/die. Both LNAs comprise a respective µTP GaN transistor 112 in common source.

Figure 24:
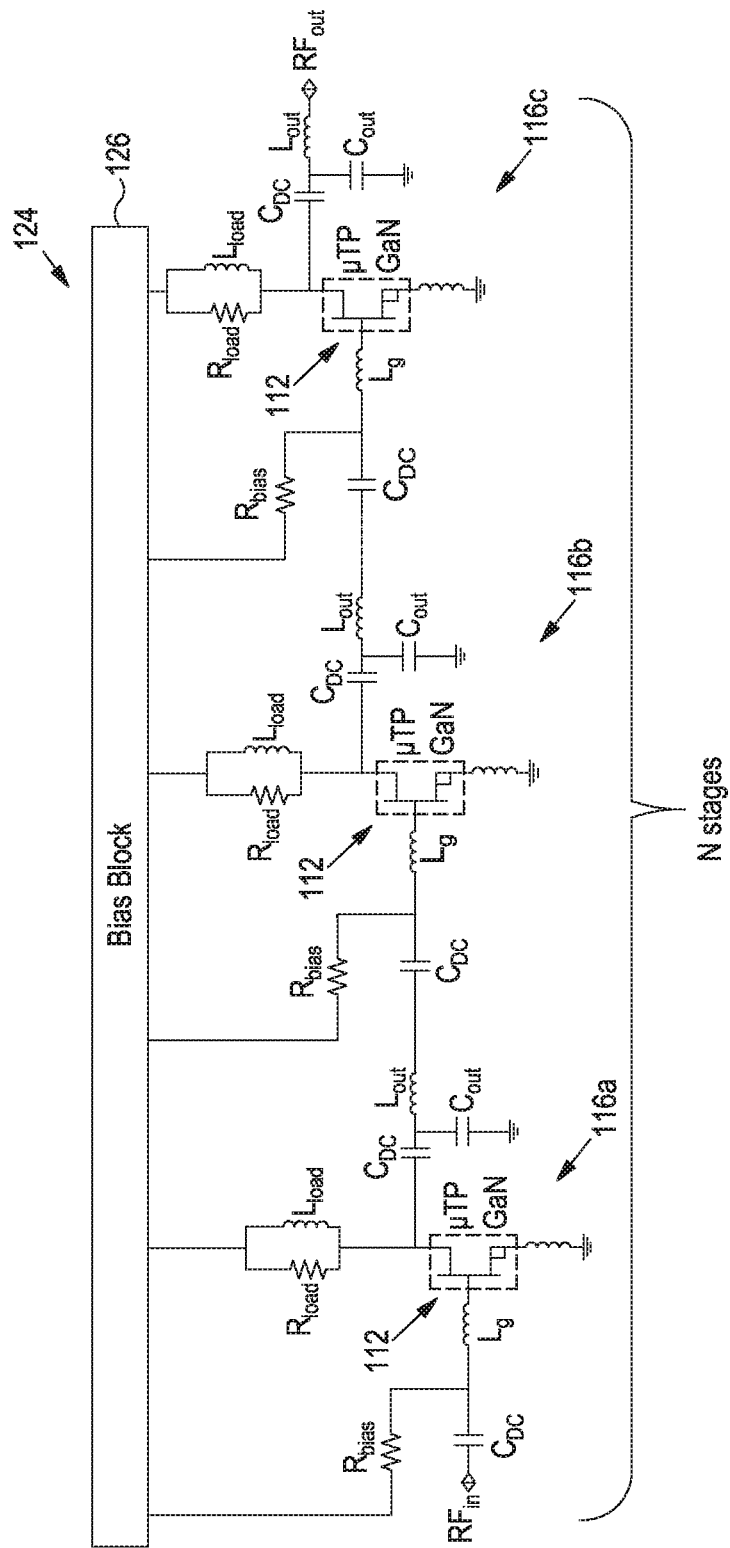
FIG. 24 is a circuit diagram of an N stage LNA according to an embodiment using micro-transfer printed GaN transistors.

FIG. 24 shows a circuit diagram of an N stage amplifier 124 (with N>2 amplification stages) according to an embodiment. Three LNAs 116*a,b,c* are shown and a dotted line between the output of the second LNA 116*b* and the input of the third LNA 116*c* indicates an arbitrary number of further LNAs connected in between. Each amplification stage can be formed from an LNA such as the one illustrated in FIG. 21. Each LNA comprises one µTP GaN transistor 112. Each LNA 116*a,b,c* can be powered by the same power supply or by separate power supplies. The bias block 126 and other components of the circuit are formed directly on the SOI wafer.

Figure 25:
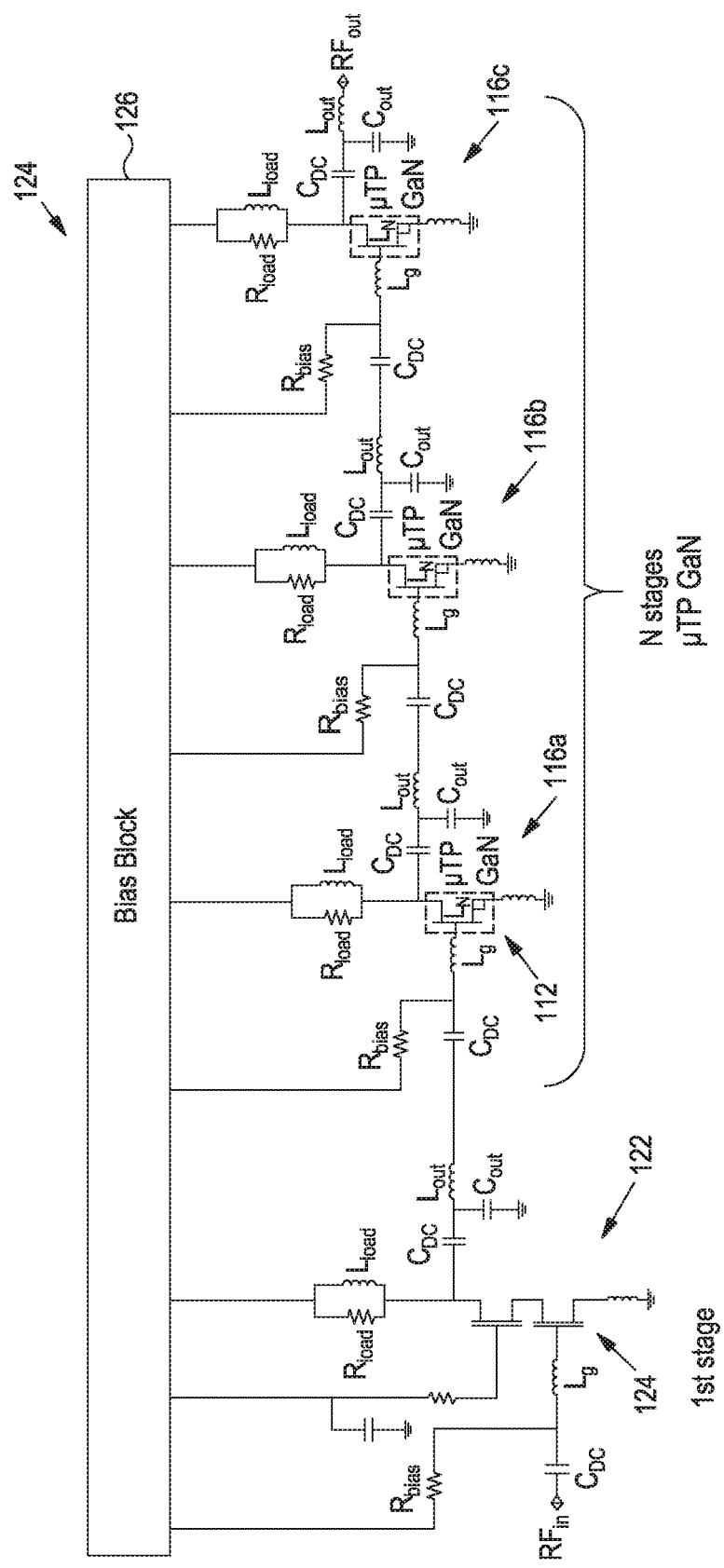
FIG. 25 is a circuit diagram of an N stage LNA according to another embodiment using an SOI cascode structure and micro-transfer printed GaN transistors.

FIG. 25 shows a circuit diagram of an N stage amplifier similar to that of FIG. 24, but where the first stage comprises an SOI cascode structure 122 with SOI transistors 124.

While specific embodiments of the invention have been described above, it will be appreciated that the invention may be practiced otherwise than as described. The descriptions above are intended to be illustrative, not limiting. It will be apparent to one skilled in the art that modifications may be made to the invention as described without departing from the scope of the claims set out below.

Each feature disclosed or illustrated in the present specification may be incorporated in the invention, whether alone or in any appropriate combination with any other feature disclosed or illustrated herein.

The invention claimed is:

1. A semiconductor structure for RF applications comprising:
   a first μTP GaN transistor on an SOI wafer or die;
   a first resistor connected to a gate of said first transistor; and
   two or more stacked SOI transistors on said SOI wafer in series with said first μTP GaN transistor.

2. A semiconductor structure according to claim 1, further comprising:
   a second μTP GaN transistor on the SOI wafer or die; and
   a second resistor connected to a gate of said second transistor.

3. A semiconductor structure according to claim 1, further comprising:
   an SOI transistor formed on said SOI wafer in series with said first μTP GaN transistor;
   a second resistor connected to a gate of said SOI transistor; and
   a third resistor connected a body of said SOI transistor.

4. A semiconductor structure according to claim 1, further comprising:
   a first switching branch comprising one or more μTP GaN transistors on the SOI wafer and connected to a first RF port;
   a second switching branch comprising one or more μTP GaN transistors on the SOI wafer or die and connected to a second RF port, wherein each μTP GaN transistor in the first and second switching branch has a gate connected to a respective resistor.

5. A semiconductor structure according to claim 4, wherein the first and second switching branches each comprises three μTP GaN transistors.

6. A semiconductor structure according to claim 4, wherein each respective resistor is connected in parallel to a diode.

7. A semiconductor structure according to claim 4, wherein said μTP GaN transistors in said first switching branch or said μTP GaN transistor in said second switching branch are on the same chiplet.

8. A semiconductor structure according to claim 4, further comprising:
   a switch driver formed on the SOI wafer and connected to said first and second switching branches;
   a bias block connected to said switch driver.

9. A semiconductor structure according to claim 4, wherein the first and second switching branches each comprises stacked SOI transistors connected in series with said one or more μTP GaN transistors.

10. A semiconductor structure according to claim 9, further comprising a second switch driver and a second bias block formed on the SOI wafer for controlling said stacked SOI transistors.

11. A semiconductor structure according to claim 1, wherein said structure is an SPDT switch.

12. A semiconductor structure according to claim 4, further comprising one or more further switching branches, wherein the or each further switching branch comprises one or more μTP GaN transistors on the SOI wafer or die.

13. A semiconductor structure according to claim 12, wherein said structure is an NPMT (N Poles and M Throws) switch.

14. A method of manufacturing a structure as claimed in claim 1 using a micro transfer printing process.

* * * * *